METHOD OF RADIOFREQUENCY SPUTTER ETCHING

Filed April 5, 1971 2 Sheets-Sheet 1

INVENTOR.
John L. Vossen
BY
Volker R. Ulbrich
ATTORNEY

Sept. 19, 1972 J. L. VOSSEN, JR 3,692,655

METHOD OF RADIOFREQUENCY SPUTTER ETCHING

Filed April 5, 1971 2 Sheets-Sheet 2

INVENTOR.
John L. Vossen
BY
Volker R. Ulbrich
ATTORNEY 3,692,655
METHOD OF RADIOFREQUENCY SPUTTER ETCHING John Louis Vossen, Jr., Bedminster, N.J., assignor to RCA Corporation Filed Apr. 5, 1971, Ser. No. 131,387
Int. Cl. C23c *15/00*
U.S. Cl. 204—192 5 Claims

ABSTRACT OF THE DISCLOSURE

A method for radiofrequency sputter etching a pattern defined by an organic photoresist mask on a surface of a material from which there are dissociated, under the conditions of sputter etching, elements or complexes which are reactive with organic photoresist. The method includes back-scattering of a relatively inert material to the photoresist to reduce degradation of the photoresist by the reactive elements or complexes.

BACKGROUND OF THE INVENTION

The invention relates to radiofrequency sputter etching, and particularly to the radiofrequency sputter etching of patterns in materials from which there are dissociated, under the conditions of sputter etching, elements or complexes which are reactive with organic photoresist.

Radiofrequency sputtering is particularly useful for etching patterns in materials which cannot be etched chemically to a suitably high definition. Techniques and equipment for radiofrequency sputter etching are described in the following:

(1) U.S. Pat. No. 3,525,680, issued Aug. 25, 1970, to P. D. Davidse et al., U.S. Cl. 204—192.

(2) J. L. Vossen et al., "R-F Sputtering Processes," RCA Review, 29, No. 2, 149–179 (June 1968).

(3) J. L. Vossen et al., "Back Scattering of Material Emitted from RF Sputtering Targets," RCA Review, 31, No. 2, 293–305 (June 1970).

Among materials which generally cannot be etched chemically to high definition are multilayer film structures, the layers of which are alternately of different materials and require each a different chemical etchant. With sputter etching, which herein means radiofrequency sputter etching, such a multilayer film structure can be readily etched, since with given sputtering conditions the etching rate for different layers is about equal.

A difficulty arises, however, with certain materials when they are sputter etched in a pattern defined by an organic photoresist masking layer. These certain materials are compounds from which there are dissociated, under the conditions of sputter etching, elements or complexes which are reactive with organic photoresist. These reactive elements or complexes of elements, which may or may not be ionized, contaminate the sputtering plasma, react with the organic photoresist, and thereby degrade the photoresist mask by reducing its ability to withstand the ion bombardment of sputtering. This difficulty is encountered, for example, in etching multilayer dichroic interference filter layers into patterns for color encoding purposes. Such filters and their use for encoding are described in the following references:

(4) U.S. Pat. 2,871,371, issued Jan. 27, 1959 to S. Gray, U.S. Cl. 250–226.

(5) U.S. Pat. 2,873,397, issued Feb. 10, 1959 to S. Gray, U.S. Cl. 313—65.

(6) U.S. Pat. 3,378,633, issued Apr. 16, 1968 to A. Macovski, U.S. Cl 178—514.

Among the materials best suited optically for color encoding filters are calcium fluoride ($CaF_2$), zinc sulfide ($ZnS$), and thorium fluoride ($ThF_4 \cdot 4H_2O$). Under the ion bombardment conditions for sputter etching these materials, the fluorine, sulfur and water elements dissociate, contaminate the sputtering plasma, and degradingly react with the photoresist masking layer on the filter defining the encoding strips. Because of the degradation, the thickness of photoresist needed for etching a pattern to a given thickness must be greatly increased, with resulting loss of pattern definition.

SUMMARY OF THE INVENTION

The novel method for sputter etching a pattern defined by an organic photoresist mask on the surface of a material from which there are dissociated under the conditions of sputter etching, elements or complexes which are reactive with organic photoresist comprises back-scattering of a relatively inert material to the photoresist, whereby degradation of the photoresist by the reactive elements or complexes is reduced.

When a material is subjected to the ion bombardment of a radiofrequency excited plasma, or sputtering gas, atoms or molecules of the material are sputtered away from the surface and enter the sputtering gas. A portion of these atoms or molecules are redeposited from the sputtering gas to any surface which is being sputtered by the same sputtering gas. This redeposition is termed back-scattering, since the redeposited material may be said to have been scattered back to the sputtering target by the sputtering gas. The relatively inert material is one which under the conditions of sputter etching does not itself substantially react chemically with organic photoresist to result in a product more volatile than both, and also does not dissociate substantially into other elements or complexes which so react.

With the novel method, the thickness of photoresist needed for etching to a given depth in a material such as zinc sulfide or thorium fluoride can be reduced to about a third of the thickness which would otherwise be needed to withstand the sputtering. The reduced thickness requirement permits better definition of the pattern to be etched.

DESCRIPTION OF THE PREFERRED EMBODIMENT

Figure 1:
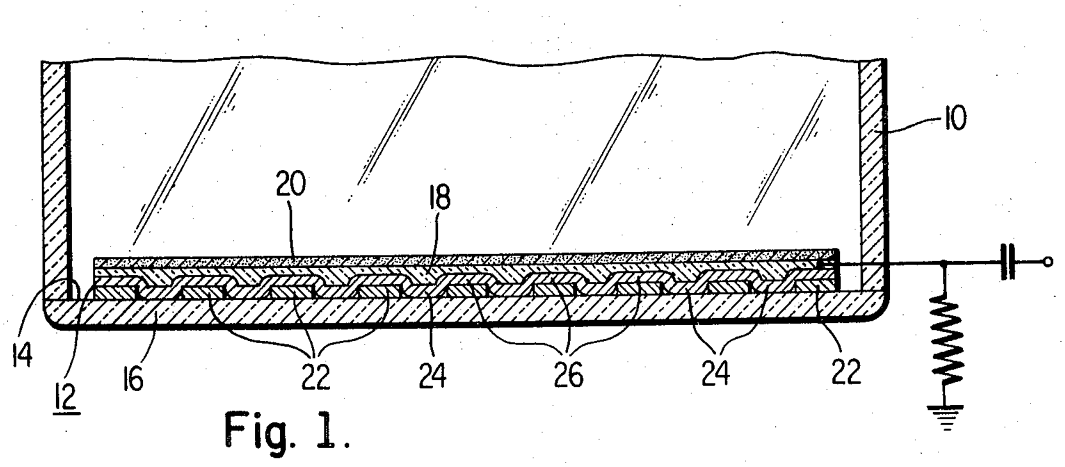
FIG. 1 is a lateral exaggerated cross-section of a vidicon camera tube end portion, including a faceplate provided with a color encoding filter made in accordance with the preferred embodiment.
Figure 2:
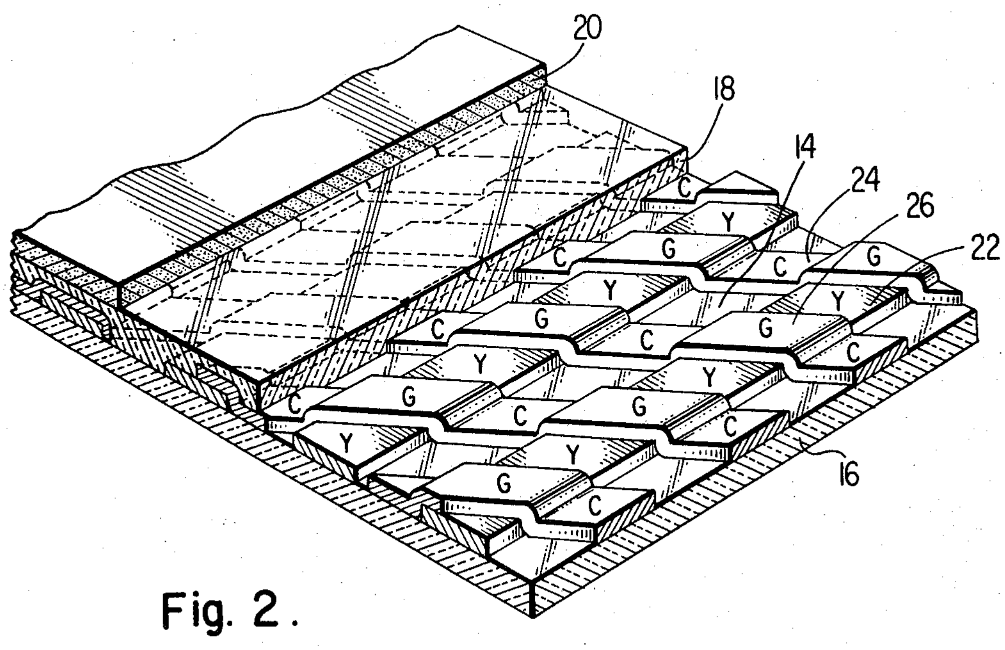
FIG. 2 is an enlarged perspective view of a surface portion of the faceplate and filter of FIG. 1.

In a preferred embodiment of the invention, a vidicon television camera tube 10 is provided with a faceplate assembly shown in FIG. 1, having a substractive primary color encoding filter 12 provided on the inner surface 14 of the tube faceplate 16 by the novel method. Covering the filter 12 is a conductive signal electrode 18, which in turn is covered by a photoconductor layer 20. Referring now to FIG. 2, the filter 12 comprises a set of parallel yellow strips 22 under a set of parallel cyan strips 24, disposed at an angle to the yellow strips 22, and a set of diamond-shaped overlap portions 26 where the yellow strips 22 and the cyan strips 24 overlap.

The encoding filter 12 of the tube 10 is formed directly on the faceplate surface 14. The clean faceplate 16 is placed in a vacuum chamber and the entire faceplate surface 14 is covered with a continuous yellow inorganic multilayer dichroic interference filter layer 28 by the following steps:

A first layer of zinc sulfide (ZnS) is evaporated from a resistance-heated tantalum boat at a vacuum pressure of about $10^{-5}$ torr to a thickness corresponding to ¼ wavelength of 4000 A. light through the faceplate and to a photomultiplier tube, and observing the output of the photomultiplier during evaporation. When the output is at a minimum, the layer is approximately one/quarter wavelength thick. A second layer, of thorium fluoride ($ThF_4 \cdot 4H_2O$), is then evaporated on the ZnS layer to a thickness of ¼ the wavelength of 4000 A. wavelength light in the $ThF_4$. The $ThF_4 \cdot 4H_2O$ is deposited by substantially the same method as the ZnS layer. The process is continued with alternating layers of ZnS and $ThF_4 \cdot 4H_2O$ until four layers of ZnS and three layers of $ThF_4 \cdot 4H_2O$ have been formed. Then, a last layer of $ThF_4 \cdot 4H_2O$ is deposited on the previous layer of ZnS to a ½ wavelength thickness.

Figure 3:
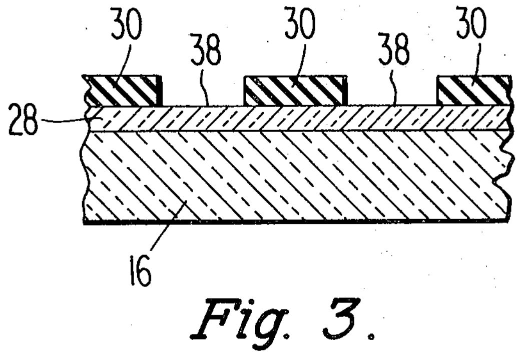
FIG. 3 is an enlarged, exaggerated sectional view of a fragment of the faceplate and filter of FIG. 1 at a stage of processing by the novel method at which a pattern is defined by a photoresist layer on a filter layer to be etched.

The faceplate 16 is now removed from the vacuum chamber and the entire yellow filter layer is covered with a photoresist mask layer 30 to a thickness of about 6000 A. as shown in FIG. 3. A commercially-available organic photoresist such as "KMER," "KTFR" or "KPR" trademark resist manufactured by the Eastman-Kodak Co. of Rochester, N.Y., is suitable for sputter etching. Alternatively, the resist may be a short oil alkyd resin combined with a sensitizer. The photoresist is exposed to a grid of light having the desired dimensions of the finished filter strip grid and then developed by standard techniques to remove unexposed photoresist, leaving a mask 30 of exposed photoresist, shown in FIG. 3, which is somewhat thicker than the filter layer.

Figure 4:
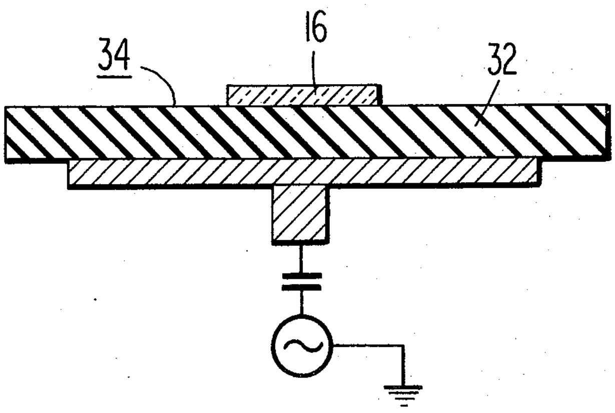
FIG. 4 is a sectional view of the FIG. 3 faceplate and filter of FIG. 1 mounted on a sputter etching target assembly for etching the filter in accordance with the novel method.

Referring now to FIG. 4, the faceplate 16 with the filter layer 12 and photoresist mask 30 on the faceplate surface 14, is now placed on a backing plate 32 which is part of a target assembly 34 for radiofrequency sputter etching as described, for instance, in the references (2) and (3) above. The backing plate 32 is a disc of silicon dioxide about 60 mils thick and about 3 inches in diameter. The mask 30, exposed filter layer areas 38, and the exposed portion of the backing plate 32 are bombarded with ions from an argon glow discharge until substantially all exposed filter layer material has been removed. During the bombarding, silicon dioxide from the backing plate 32 back-scatters to the photoresist mask 30 and reduces degradation of the mask 30 by fluorine, sulfur or water dissociated from the filter layer 28. The depth of etching is monitored by time measurement. The etching rate varies somewhat with the general etching conditions. However, the correct etching time can be readily determined for a particular system with particular parameters by a short series of trails. The particular values of several important parameters during the etching step for the preferred embodiment were a peak-to-peak radiofrequency voltage of 2750 volts, a radiofrequency of 7.4 megahertz, a magnetic glow containment field of 35 gauss in the etch region, a sheath voltage of 680 volts negative, a distance of 3½" from the sputtering target to a grounded plate above the target, and an argon pressure of about $2.7 \times 10^{-3}$ torr. The peak-to-peak voltage and sheath voltage can be varied considerably within a wide range. The etching rate varies with both the peak-to-peak and sheath voltage. Depending upon what rate of etching is desired, the peak-to-peak voltage can be as high as 3800 volts and the sheath voltage, which is dependent on the peak-to-peak voltage, can be as much as 950 volts. At higher voltages, radiation damage to the filter layer becomes significant. The magnetic field strength may be as high as 60 gauss. However, stronger fields result in uneven etching rates.

The etching time required for etching away the exposed yellow filter layer 28 material with the above etching conditions is about 70 minutes. Although the exposed filter material is entirely removed, the photoresist mask 30 on the unexposed filter areas is sufficiently thick that it is not entirely removed. It therefore completely shields the underlying filter 28 from sputtering effects.

The mask 30 material remaining after the etching step is removed by a short sputter etching in an oxygen discharge for a period of about 5 minutes with an oxygen pressure of about $3 \times 10^{-2}$ torr, a peak-to-peak radiofrequency voltage of about 2000 volts, an average surface potential of about 500 volts negative of the photoresist, and a magnetic field of about 35 gauss. The mask 30 material is thereby carbonized and turned to volatile materials which evaporate harmlessly off the surface without degrading the underlying yellow filter strips 22.

After completion of the etching of the yellow strips 22, the entire faceplate surface 14 and the yellow strips 22 are covered with a continuous inorganic, cyan, multilayer, interference filter layer. The cyan filter layer is deposited by evaporation much as the yellow filter layer was deposited. The first layer is ZnS. Alternating layers of $ThF_4 \cdot 4H_2O$ and ZnS are deposited until there are five layers of ZnS and four layers of $ThF_4 \cdot 4H_2O$. All these layers however, have their thickness monitored with light having a 7000 A. wavelength. Thus, each layer has a thickness which corresponds to ¼ the wavelength of 7000 A. light in the layer. A final layer of $ThF_4 \cdot 4H_2O$ is then added. This last layer is monitored with 5300 A. light instead of the 7000 A. light used for the other layers and is somewhat thinner than the preceding $ThF_4 \cdot 4H_2O$ layers.

By the same techniques used for etching the yellow filter layer into a grid, the cyan filter layer is etched into a grid which is at 45° to the yellow grid. The etching parameters are generally the same as those for etching the yellow filters, except that the etch time is approximately 7.7% longer than that required for the yellow filter, due to the greater thickness of the cyan filter. By accurately timing the etching of the cyan filter layer, the cyan filter layer can be etched off to a predetermined thickness with an accuracy of within about 1.5% of the original filter layer thickness. That accuracy is sufficient to permit etching the exposed cyan filter material off the underlying yellow filter strips 22 without damage to the yellow filter strips 22 in the process.

GENERAL CONSIDERATIONS

The backing plate, from which material is back-scattered to the photoresist, should be an element or compound which reduces photoresist degradation, is relatively inert, and does not dissociate to a substantial extent into more reactive substances. For optical filter etching, oxides are particularly suitable because they have little or no undesirable affects on the optical properties of the filter. Since oxygen is highly reactive with photoresist under sputter etching conditions, the oxide chosen must be stable enough that it does not dissociate substantially. A number of oxides are very stable under sputter etching conditions. The extent to which an element or complex dissociates from a compound under the ion bombardment conditions of sputter etching appears to be related to the strength of the chemical bond between constitutents of the compound, which in turn appears to be related to the heat of dissociation per dissociated element or complex for the molecule. The heat of dissociation per dissociated atom has been experimentally determined for a number of oxides as given in the following table.

| Molecule: | Heat of dissociation per oxygen atom (in kilocal. per mole) |
|---|---|
| $PbO_2$ | 33.06 |
| $Bi_2O_3$ | 46 |
| PbO | 52.2 |
| CoO | 57.2 |
| NiO | 58.4 |
| CdO | 60.86 |
| $SnO_2$ | 69.4 |
| $V_2O_5$ | 74.6 |
| $Cr_2O_3$ | 89.8 |
| $Nb_2O_5$ | 92.64 |
| $TiO_2$ | 109.0 |
| $ZrO_2$ | 129.2 |
| BaO | 133.4 |
| * * * * * | |
| SrO | 141.2 |
| MgO | 143.84 |
| CaO | 151.8 |
| $La_2O_3$ | 152.5 |
| $SiO_2$ | 153.9 |
| $Al_2O_3$ | 195.9 |

Under the conditions generally used for sputter etching, those compounds listed which had a heat of dissociation per oxygen atom of less than about 135 kcal./mole (above the dashed line in the table) dissociated to a substantial extent, while those with a heat of dissociation higher than this value (below the dashed line) did not. Of those with a higher value, MgO, $SiO_2$, and $Al_2O_3$ are suitable as backing plate materials, while the others are unsuitable because they have other physical properties, such as being hygroscopic, which make their use in a vacuum impracticable. $Al_2O_3$, while reducing photoresist degradation, has the disadvantage that it also greatly slows the etching process because of its low deposition rate. $SiO_2$, on the other hand, appears to be the most useful compound on the list for the backing plate. It is readily available in dense, cast discs, is essentially inert, dissociates only to an insignificant extent, and reduces degradation of the photoresist. Moreover, $SiO_2$ does not degrade the optical properties of filters, such as those of the preferred embodiment, since it is sufficiently transparent in thin layers. In addition to the oxides specifically mentioned here, there are a number of other backing plate materials such as, for instance, certain glasses which meet the requirements discussed here with respect to oxides and are therefore suitable for practicing the novel method. Such other suitable materials, including, for instance, borosilicate glasses, generally are found to consist primarily, at least 50%, of one or more of the aforementioned oxides of aluminum, magnesium or silicon.

The extent of back-scattering from the backing plate to the photoresist for given sputter-etching conditions depends upon the proportion of backing plate exposed to bombardment. While it is desirable to expose at least about as much backing plate surface as photoresist surface, the precise ratio is not critical.

Photoresist consisting essentially of a short oil alkyd resin and a sensitizer is particularly well suited for radiofrequency sputter etching. Such a photoresist has not only a suprising degree of resistance to the sputter etching, but also is particularly advantageous for use with the novel method, since the back-scattering of silicon dioxide on this photoresist reduces degradation of a substantially greater extent than is the case for other photoresists. Thus, this photoresist may be used in a thinner layer. A thinner layer of photoresist results in better definition of the etched pattern. Since the photoresist for the preferred embodiment is not presently known to be available commercially, a process for its preparation is given here:

A short oil alkyd resin is prepared by reacting together:

| | Percent by weight |
|---|---|
| Tall oil fatty acid (1% resin) | 25.0 |
| Phthalic anhydride | 35.5 |
| Pentaerythritol | 18.0 |
| Trimethylol propane | 16.9 |
| Benzoic acid | 4.6 |

The ingredients are reacted at a temperature of about 200° C. until the product has an acid number of between 5 and 25.

The alkyd resin thus prepared in an amount of, for example, 225 gms., is heated with stirring to 200° C. for one hour under nitrogen, then cooled to 100° C. Methylcyclohexane in an amount of 900 ml., is added and the mixture is heated to reflux with stirring. After 1 hour, heating and stirring are discontinued and supernatant liquid is decanted. The remaining imbibed solvent is removed by distillation after whch the recovered polymer, approximately 185 gms., is dissolved in the desired solvent, decanted and filtered.

The above-described treatment is for the purpose of removing the low molecular weight ends of the alkyd resin. Preferably, about 15–40% of the original material should be removed.

To make up a photoresist material, the modified alkyd resin is dissolved in toluene or a mixture of toluene and xylene to make up a 20 wt. percent solution. A sensitizer is then added in an amount of about 6 wt. percent of the resin. The sensitizer may be, for example, 2,6-bis(para-azidobenzylidene)-4-methylcyclohexanone. Other suitable sensitizers are: benzoin, benzophenone, 2,3-butanedione, 4,4,4,4'- - bis-(dimethylamino) benzophenone, benzoin methyl ether, 2-methylanthraquinone, and 2-chloroanthraquinone. Mixtures of these may also be used.

What is claimed is:

1. In a method for sputter etching a pattern defined by an organic photoresist mask on the surface of a material from which there are dissociated, under the conditions of sputter etching, elements or complexes which are reactive with the photoresist, the sputtering being by radiofrequency stimulated glow discharge induced in an ionizable gas plasma by a radiofrequency power source, the improvement, comprising:

(a) locating a body of substantially inert, stable material near the material to be etched, and (b) back-scattering a quantity of inert, stable material from the body to the photoresist mask during the sputter etching, whereby degradation of the photoresist mask by the reactive elements or complexes is reduced.

2. The method defined in claim 1 wherein the back-scattered material consists primarily of oxide of one or more of the elements aluminum, magnesium, and silicon.

3. The method defined in claim 1 wherein the back-scattered material is silicon dioxide.

4. The method defined in claim 1 and wherein said photoresist comprises essentially an alkyd resin in a sensitizer.

5. The method defined in claim 4 and wherein said alkyd resin is a short oil alkyd resin.

References Cited

UNITED STATES PATENTS

| | | | |
|---|---|---|---|
| 3,525,680 | 8/1970 | Davidse et al. | 204—192 |
| 3,640,811 | 2/1972 | Vossen | 204—192 |
| 3,640,812 | 2/1972 | Vossen et al. | 204—192 |
| 3,479,269 | 11/1969 | Byrnes et al. | 204—192 |
| 3,271,286 | 2/1964 | Lepselter | 204—192 |

OTHER REFERENCES

Vossen et al.: "Back Scattering of Material Emitted From RF Sputtered Targets," RCA Review, June 1970, vol. 31, No. 2, pp. 293-305.

JOHN H. MACK, Primary Examiner

S. S. KANTER, Assistant Examiner